United States Patent
Chao et al.

(10) Patent No.: US 10,636,752 B2
(45) Date of Patent: Apr. 28, 2020

(54) INTEGRATED CIRCUIT AND TRANSMISSION CIRCUIT THEREOF

(71) Applicant: RichWave Technology Corp., Taipei (TW)

(72) Inventors: Chuan-Chen Chao, Taipei (TW); E-Jen Lien, Taipei (TW)

(73) Assignee: RichWave Technology Corp., Taipei (TW)

( * ) Notice: Subject to any disclaimer, the term of this patent is extended or adjusted under 35 U.S.C. 154(b) by 83 days.

(21) Appl. No.: 15/956,760

(22) Filed: Apr. 19, 2018

(65) Prior Publication Data

US 2019/0221530 A1    Jul. 18, 2019

(30) Foreign Application Priority Data

Jan. 12, 2018    (TW) .............. 107101182 A

(51) Int. Cl.
*H01L 23/66* (2006.01)
*H05K 1/02* (2006.01)
*H04B 1/40* (2015.01)

(52) U.S. Cl.
CPC .............. *H01L 23/66* (2013.01); *H04B 1/40* (2013.01); *H05K 1/0239* (2013.01)

(58) Field of Classification Search
CPC .. H01L 23/66; H05K 1/0239; H03K 19/0013; H03K 3/00; H03K 19/018521; G11C 11/4093; G11C 11/4096; G11C 7/1051; G11C 7/1078; G11C 7/1084
See application file for complete search history.

(56) References Cited

U.S. PATENT DOCUMENTS

| | | | |
|---|---|---|---|
| 5,319,259 A | 6/1994 | Merrill | |
| 6,225,838 B1 | 5/2001 | Lee | |
| 7,847,616 B2 | 12/2010 | Hashimoto | |
| 7,969,191 B2 | 6/2011 | Nedalgi | |
| 8,400,190 B2 * | 3/2013 | Hung | H03K 19/0002 327/108 |
| 9,607,668 B2 * | 3/2017 | Bringivijayaraghavan | G11C 7/1048 |

FOREIGN PATENT DOCUMENTS

| | | |
|---|---|---|
| CN | 102668380 | 9/2012 |
| TW | 1379516 | 12/2012 |

\* cited by examiner

*Primary Examiner* — Jung Kim
(74) *Attorney, Agent, or Firm* — JCIPRNET

(57) ABSTRACT

An integrated circuit and a transmission circuit thereof are provided. The transmission circuit includes an input buffer and a voltage holding circuit. The voltage holding circuit has a first end coupled to the input end of the input buffer, and a second end coupled to a reference voltage end. The voltage holding circuit includes a switch and a diode apparatus coupled in series between the first end and the second end of the voltage holding circuit. The switch is configured to receive a mode signal, and is turned on or cut off according to the mode signal.

16 Claims, 6 Drawing Sheets

US 10,636,752 B2

INTEGRATED CIRCUIT AND TRANSMISSION CIRCUIT THEREOF

CROSS-REFERENCE TO RELATED APPLICATION

This application claims the priority benefit of Taiwan application serial no. 107101182 which was filed on Jan. 12, 2018. The entirety of the abovementioned patent application is hereby incorporated by reference herein and made a part of this specification.

BACKGROUND

Technical Field

The disclosure relates to an integrated circuit and a transmission circuit thereof, particularly to an integrated circuit which is capable of reducing leakage current, and a transmission circuit thereof.

Related Art

In an integrated circuit, one or more input buffers are often disposed. The input buffer is configured to receive an input signal from the outside and provide an output signal to the inside of the integrated circuit for processing. It is worth mentioning that, when no signal is applied to an input end of the input buffer, the input end of the input buffer may be in a floating state. This floating state of the input end of the input buffer may lead to an indeterminate voltage at the control end of a transistor in the input buffer, and this may make the transistor to work in an unpredictable state and generate the leakage current.

In addition, when the input end of the input buffer stays in the floating state, the input buffer may therefore generate an unstable output voltage. In this way, in the integrated circuit, a logic circuit element that receives the unstable output voltage from the input buffer may generate more leakage current, resulting in whole current leakage of the integrated circuit to some extent.

SUMMARY

The transmission circuit of the disclosure includes an input buffer and a voltage holding circuit. The input buffer has an input end coupled to a pad. The voltage holding circuit has a first end coupled to the input end of the input buffer, and a second end coupled to a reference voltage end, wherein the voltage holding circuit includes a switch and a diode apparatus coupled in series between the first end and the second end. The switch is configured to receive a mode signal, and it is turned on or cut off according to the mode signal.

The integrated circuit of the disclosure includes a core circuit and at least one abovementioned transmission circuit, wherein the transmission circuit is coupled to the core circuit.

To make the above disclosure more comprehensible, several embodiments accompanied with drawings are described in detail as follows.

DETAILED DESCRIPTION OF DISCLOSED EMBODIMENTS

Embodiments of the disclosure provide an integrated circuit and a transmission circuit thereof, in which when a pad is floating, leakage current that may occur is effectively reduced, and when the pad is not in the floating state, acceptable extra leakage current is maintained.

Figure 1:
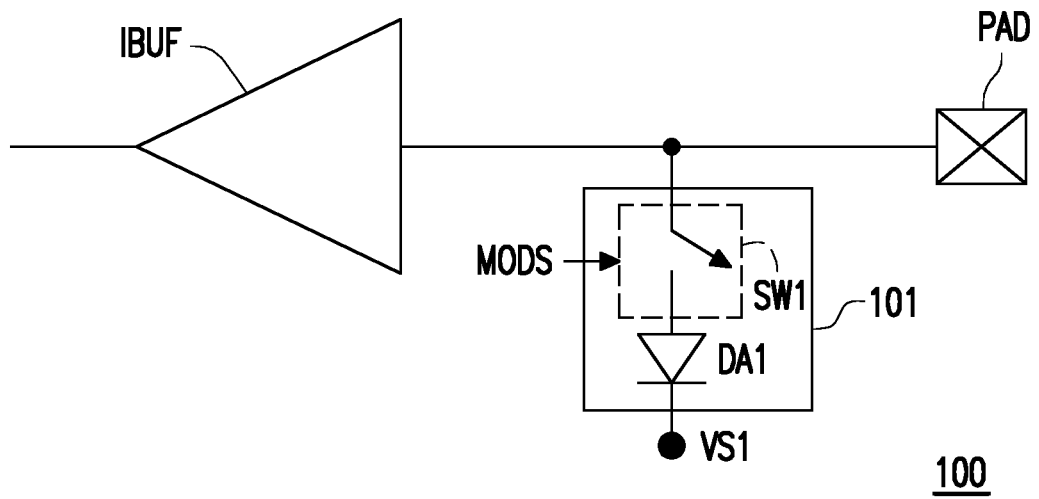
FIG. 1 illustrates a schematic diagram of a transmission circuit according to an embodiment of the disclosure.

Referring to FIG. 1, FIG. 1 illustrates a schematic diagram of a transmission circuit according to an embodiment of the disclosure. A transmission circuit 100 includes an input buffer IBUF and a voltage holding circuit 101. The input buffer IBUF has an input end coupled to a pad (hereinafter referred to as "PAD"). The voltage holding circuit 101 is coupled between the input end of the input buffer IBUF and a reference voltage end VS1. The voltage holding circuit 101 includes a switch SW1 and a diode apparatus DA1 coupled in series. In the embodiment, one end (e.g., first end) of the switch SW1 is coupled to the input end of the input buffer IBUF, the other end (e.g., second end) of the switch SW1 is coupled to the anode end (e.g., first end) of the diode apparatus DA1, and the cathode end (e.g., second end) of the diode apparatus DA1 is coupled to the reference voltage end VS1. The switch SW1 is controlled by a mode signal MODS to be turned on or cut off. The mode signal MODS is determined by the input buffer IBUF. In detail, when the input buffer IBUF is enabled, the corresponding mode signal MODS may cause the switch SW1 to be turned on; by contrast, when the input buffer IBUF is disabled, the corresponding mode signal MODS may cause the switch SW1 to be cut off. In one embodiment, the diode apparatus DA1 includes, for example, at least one or a plurality of diodes coupled in series. In another embodiment, the input buffer IBUF may be a hysteresis, e.g., Schmitt trigger, input buffer.

More specifically, when the input buffer IBUF is enabled, the switch SW1 is turned on according to the mode signal MODS. Meanwhile, the voltage at the input end of the input buffer IBUF may be pulled down through the diode apparatus DA1 according to the voltage at the reference voltage end VS1. In the embodiment, the reference voltage end VS1 receives a common voltage (e.g., ground) having a relatively low voltage level.

It can be inferred from the above descriptions that, when the input buffer IBUF is enabled and no voltage is applied to the PAD, the input end of the input buffer IBUF could be set to a predetermined voltage level under action of the voltage holding circuit 101, thus preventing floating of the input end of the input buffer IBUF, thereby effectively reducing leakage current that may occur. It should be noted that, in the embodiment, the aforesaid predetermined voltage level may be equal to the voltage level of the common voltage, or may be between the voltage level of the common voltage and the sum of the voltage level of the common voltage and the turn-on voltage of the diode apparatus DA1. In addition, when the input buffer IBUF is enabled and a high voltage level is applied to the PAD by an external circuit, the voltage holding circuit 101 may generate an extra large amount of leakage current if only the switch SW1 is disposed in the voltage holding circuit 101. The diode apparatus DA1 of the embodiment may effectively reduce leakage current which may further be reduced by combining the diode apparatus DA1 with the switch SW1 having a high on-resistance. Moreover, the voltage level of the PAD may be maintained at the high voltage level applied by the external circuit. In one embodiment, the on-resistance of the switch SW1 is about 1 MΩ or greater, which may reduce the leakage current to about the order of μA.

On the other hand, when the input buffer IBUF is disabled, the switch SW1 is cut off, and the path between the input end of the input buffer IBUF and the reference voltage end VS1 is cut off. Meanwhile, if a voltage is applied to the PAD, the voltage holding circuit 101 does not generate extra leakage current.

In the embodiment, the mode signal MODS may be provided by the integrated circuit to which the transmission circuit 100 belongs. The integrated circuit may set the input buffer IBUF enabled or disabled depending on whether the input buffer IBUF is in the state of receiving signal, and it generates the mode signal MODS corresponding to the state of input buffer IBUF. In the embodiments, when the input buffer IBUF is enabled, the integrated circuit may set the input buffer IBUF to operate in the first mode (writing mode), and it generates mode signal MODS at the first logic level correspondingly; when the input buffer IBUF is disabled, the integrated circuit may set the input buffer IBUF to operate in the second mode (non-writing mode), and MODS may be at the second logic level, herein the first logic level and the second logic level are different. For example, they are opposite or 0 and 1 respectively.

Figure 2:
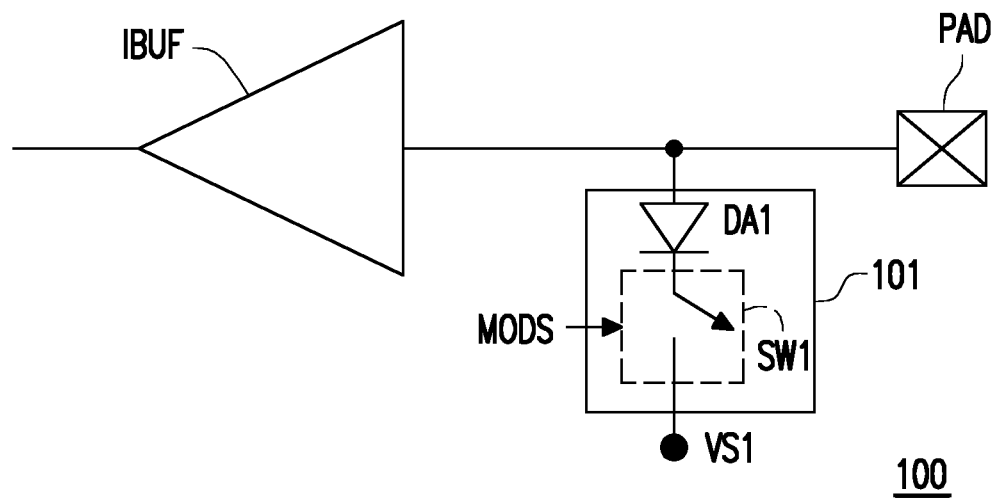
FIG. 2 illustrates a schematic diagram of another implementation of a voltage holding circuit 101 of the embodiment of FIG. 1 of the disclosure.

Referring next to FIG. 2, FIG. 2 illustrates a schematic diagram of another implementation of the voltage holding circuit 101 of the embodiment FIG. 1 of the disclosure. The voltage holding circuit 101 in FIG. 2 has similarity to operating principle in FIG. 1, but a key difference lies in that the switch SW1 and the diode apparatus DA1 in the voltage holding circuit 101 are coupled in a different manner in FIG. 1 therefrom. In the implementation, the diode apparatus DA1 is coupled between the input end of the input buffer IBUF and the switch SW1, and the switch SW1 is coupled between the diode apparatus DA1 and the reference voltage end VS1. The anode end (e.g., first end) of the diode apparatus DA1 is coupled to the input end of the input buffer IBUF; the cathode end (e.g., second end) of the diode apparatus DA1 is coupled to one end of the switch SW1. The other end of the switch SW1 is coupled to the reference voltage end VS1.

Figure 3:
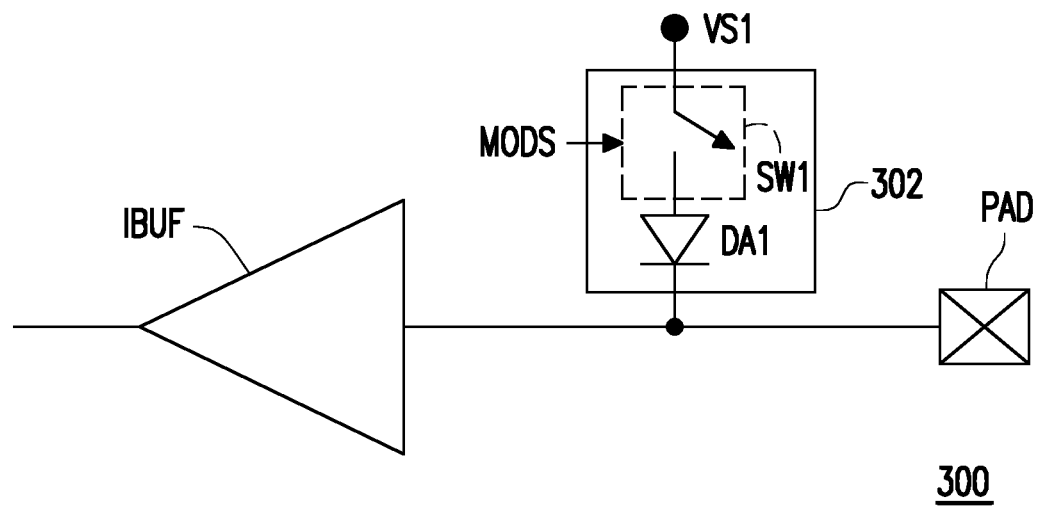
FIG. 3 illustrates a schematic diagram of a transmission circuit according to another embodiment of the disclosure.

Referring to FIG. 3, FIG. 3 illustrates a schematic diagram of a transmission circuit according to another embodiment of the disclosure. A transmission circuit 300 includes an input buffer IBUF and a voltage holding circuit 302. The input buffer IBUF has an input end coupled to a PAD. The voltage holding circuit 302 is coupled between the input end of the input buffer IBUF and the reference voltage end VS1. The voltage holding circuit 302 includes a switch SW1 and a diode apparatus DA1 coupled in series. Specifically, one end (e.g., second end) of the switch SW1 is coupled to the reference voltage end VS1, the other end (e.g., first end) of the switch SW1 is coupled to the anode end (e.g., second end) of the diode apparatus DA1, and the cathode end (e.g., first end) of the diode apparatus DA1 is coupled to the input end of the input buffer IBUF. The switch SW1 is controlled by a mode signal MODS. Similarly to the aforesaid embodiments, the mode signal MODS is determined by whether or not the input buffer IBUF is enabled. In detail, when the input buffer IBUF is enabled, the corresponding mode signal MODS may cause the switch SW1 to be turned on; by contrast, when the input buffer IBUF is disabled, the corresponding mode signal MODS may cause the switch SW1 to be cut off.

Meanwhile, in the embodiment, the reference voltage end VS1 receives an relatively high voltage level. Thus, when the switch SW1 is turned on according to the mode signal MODS and no voltage is applied to the PAD, the diode apparatus DA1 may be turned on to pull up the voltage at the input end of the input buffer IBUF to a predetermined voltage level. In the embodiment, the predetermined voltage level may be equal to the voltage level of the reference voltage end VS1, or may be between the voltage level of VS1 and the value obtained by subtracting the turn-on voltage of the diode apparatus DA1 from VS1. In addition, when the input buffer IBUF is enabled and a low voltage level is applied to the PAD by an external circuit, the voltage holding circuit 302 may generate an extra large amount of leakage current if only the switch SW1 is disposed in the voltage holding circuit 302. The diode apparatus DA1 of the embodiment may effectively reduce leakage current which may further be reduced by combining the diode apparatus DA1 with the switch SW1 having a high on-resistance. Moreover, the voltage level of the PAD may be maintained at the low voltage level applied by the external circuit. In one embodiment, the on-resistance of the switch SW1 is about 1 MΩ or greater, which may reduce the leakage current to about the order of μA.

In addition, when the input buffer IBUF is disabled, the switch SW1 is cut off, and the path between the input end of the input buffer IBUF and the reference voltage end VS1 is cut off. Meanwhile, if a voltage is applied to the PAD, the voltage holding circuit 302 does not generate extra leakage current.

Figure 4:
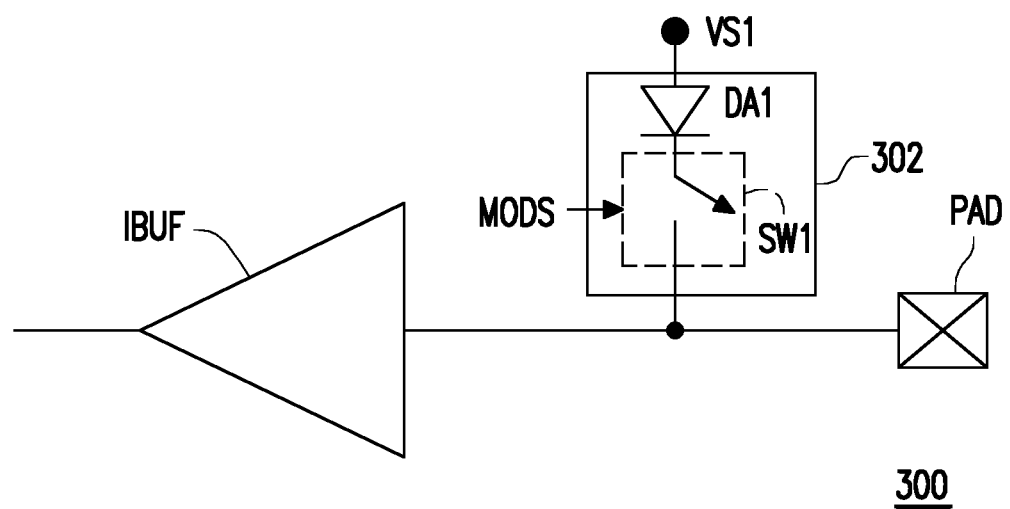
FIG. 4 illustrates a schematic diagram of another implementation of a voltage holding circuit 302 of the embodiment of FIG. 3 of the disclosure.

Referring next to FIG. 4, FIG. 4 illustrates a schematic diagram of another implementation of the voltage holding circuit 302 of the embodiment FIG. 3 of the disclosure. The voltage holding circuit 302 in FIG. 4 has similarity with operating principle to that in FIG. 3, and a key difference lies in that the coupling manner between the diode apparatus DA1 and the switch SW1 is different from that illustrated in FIG. 3. In FIG. 4, the diode apparatus DA1 is coupled between the reference voltage end VS1 and the switch SW1, and the switch SW1 is coupled between the diode apparatus DA1 and the input end of the input buffer IBUF. Specifically, the anode end (e.g., second end) of the diode apparatus DA1 is coupled to the reference voltage end VS1, the cathode end (e.g., first end) of the diode apparatus DA1 is coupled to one end (e.g., second end) of the switch SW1, and the other end (e.g., first end) of the switch SW1 is coupled to the input end of the input buffer IBUF.

In the aforesaid embodiments, the diode apparatus DA1 may be in the form of a junction diode, a Schottky diode, a voltage-regulator diode, a Zener diode, a current regulative diode, a constant current diode, or a varactor.

Figure 5A:
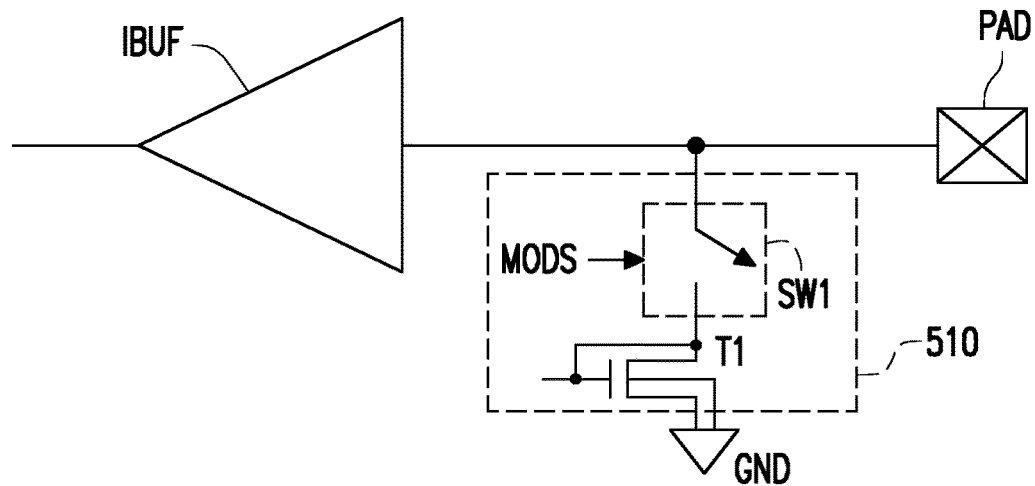
FIG. 5A illustrates a schematic diagram of a transmission circuit according to an embodiment of the disclosure.

Referring to FIG. 5A, FIG. 5A illustrates a schematic diagram of a transmission circuit according to an embodiment of the disclosure. A transmission circuit 501 includes an input buffer IBUF and a voltage holding circuit 510. The input end of the input buffer IBUF is coupled to a PAD, and the voltage holding circuit 510 is coupled to the input end of the input buffer IBUF. The voltage holding circuit 510 includes a switch SW1 and a diode apparatus is formed by a transistor T1. The transistor T1 is an N-type metal-oxide-semiconductor field-effect transistor (hereinafter referred to as "MOSFET") in diode-connected style to form the diode apparatus. To describe in more detail, a first end and a control end of the transistor T1 are coupled to each other to form the anode end (e.g., first end) of the diode apparatus, and are jointly coupled to the switch SW1. In addition, a second end of the transistor T1 serves as the cathode end (e.g., second end) of the diode apparatus and is coupled to a reference voltage end to receive a common voltage GND. In one embodiment, the bulk of the transistor T1 may be directly coupled to the second end of the transistor T1 to receive the common voltage GND. In another embodiment, the bulk of the transistor T1 may be indirectly coupled to the second end of the transistor T1 via another switch serially coupled between the transistor T1 and the common voltage GND.

In the embodiment, the transistor T1 may be a P-type MOSFET, an N-type MOSFET, a bipolar transistor, or a junction field-effect transistor (hereinafter referred to as "JFET"), and be a diode-connected transistor to form the diode apparatus. In addition, the positions of the transistor T1 and the switch SW1 may be swappable. That is, the transistor T1 may be coupled between the input end of the input buffer IBUF and the switch SW1, and the switch SW1 may be coupled between the transistor T1 and the reference voltage end (common voltage GND).

Figure 5B:
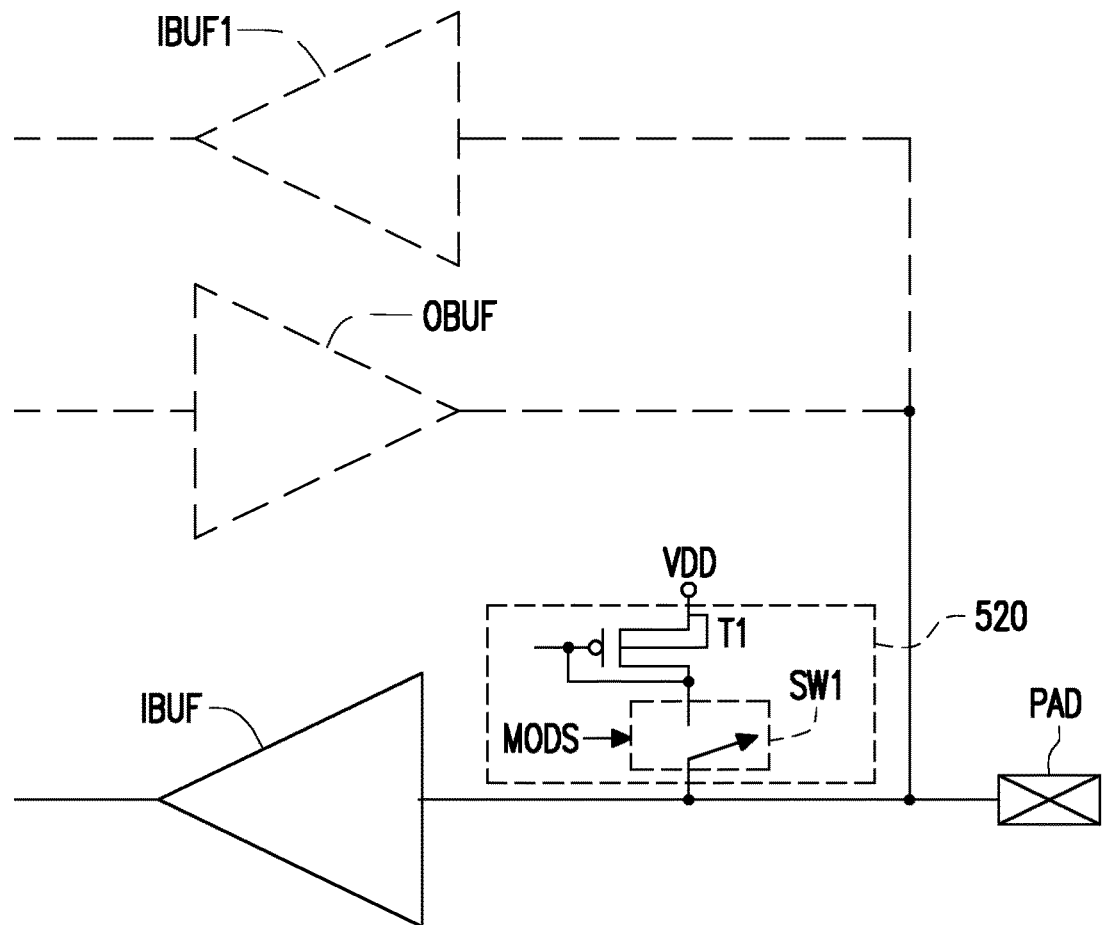
FIG. 5B illustrates a schematic diagram of a transmission circuit according to an embodiment of the disclosure.

Referring to FIG. 5B, FIG. 5B illustrates a schematic diagram of a transmission circuit according to an embodiment of the disclosure. A transmission circuit 502 includes input buffers IBUF and IBUF1, an output buffer OBUF, and a voltage holding circuit 520. The input ends of IBUF and IBUF1 are coupled to the PAD and the voltage holding circuit 520 is coupled to the input end of the input buffer IBUF. The voltage holding circuit 520 includes a switch SW1 and a diode apparatus formed of a transistor T1. The transistor T1 is an P-type MOSFET in diode-connected form to form the diode apparatus.

The voltage holding circuit 520 is coupled between a reference voltage end that provides an operation voltage (e.g., power supply voltage VDD) and the input end of the input buffer IBUF. The switch SW1 and the transistor T1 are sequentially coupled in series between the reference voltage end and the input end of the input buffer IBUF. In FIG. 5B, the transistor T1 is coupled in series between the reference voltage end and the switch SW1; the switch SW1 is coupled between the transistor T1 and the input end of the input buffer IBUF. In other embodiments of the disclosure, the positions of the transistor T1 and the switch SW1 may be swappable and there is no particular limitation. In FIG. 5B, the bulk of the transistor T1 is coupled to the second end of the transistor T1 and directly receives the power supply voltage VDD. In another embodiment, the bulk of the transistor T1 may be indirectly coupled to the second end of the transistor T1 via another switch serially coupled between the transistor T1 and the reference voltage end.

In the embodiment, the transistor T1 may be a P-type MOSFET, an N-type MOSFET, a bipolar transistor, or a JFET, and be a diode-connected transistor to form the diode apparatus. The switch SW1 may be a MOSFET, a bipolar transistor, or a JFET.

In one embodiment, the transmission circuit 502 may include the input buffer IBUF, the output buffer OBUF and the voltage holding circuit 520, wherein the input end of the input buffer IBUF may also be coupled to the output end of the output buffer OBUF to make the transmission circuit 502 to be an input/output buffer (IO buffer) circuit. In another embodiment, the transmission circuit 502 may include the input buffers IBUF and IBUF1, and the voltage holding circuit 520, wherein the input end of the input buffer IBUF may be coupled to the input ends of one or more input buffers IBUF1. In another embodiment, the voltage holding circuit 520 in the transmission circuit 502 may be replaced with the voltage holding circuit 510.

Figure 6A:
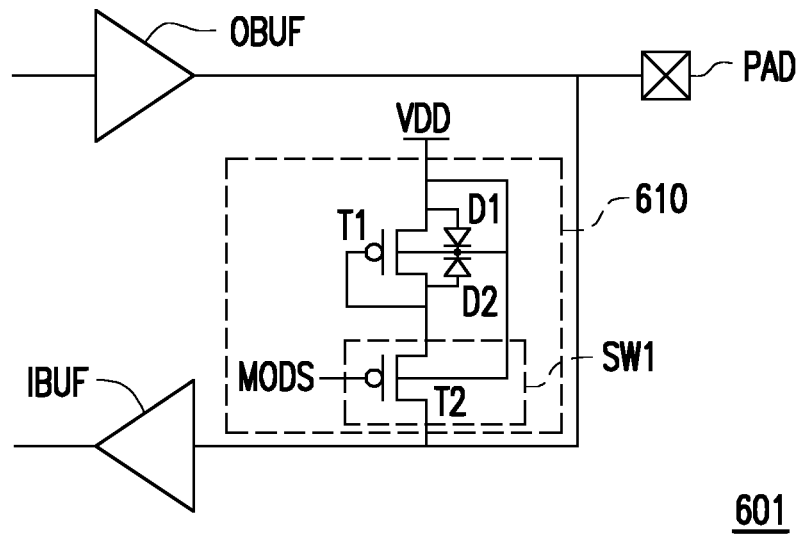
FIG. 6A and FIG. 6B illustrate schematic diagrams of different implementations of transmission circuits according to embodiments of the disclosure respectively.
Figure 6B:
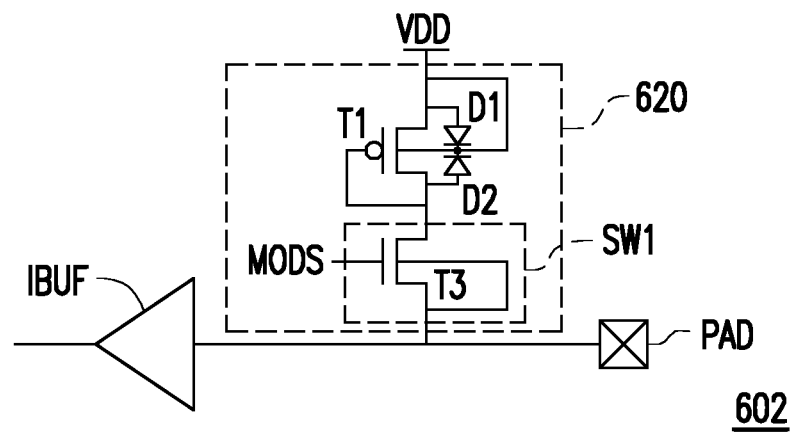

Referring next to FIG. 6A-6B, FIGS. 6A and 6B respectively illustrate schematic diagrams of different implementations of transmission circuits according to embodiments of the disclosure. In FIG. 6A, a transmission circuit 601 includes the input buffer IBUF, the output buffer OBUF and a voltage holding circuit 610. The voltage holding circuit 610 is coupled between the operation voltage (e.g., power supply voltage VDD) and the input end of the input buffer IBUF. The voltage holding circuit 610 includes a diode apparatus formed by a transistor T1, and a switch SW1 formed by a transistor T2. The second end of the transistor T1 receives the power supply voltage VDD. The control end and the first end of the transistor T1 are coupled to each other and are jointly coupled to a second end of the transistor T2. A first end of the transistor T2 is coupled to the input end of the input buffer IBUF, a control end of the transistor T2 receives a mode signal MODS, and the bulks of the transistors T1 and T2 may be coupled to each other and may directly receive the power supply voltage VDD. A parasitic diode D2 is present between the first end and the bulk of the transistor T1; a parasitic diode D1 is present between the second end and the bulk of the transistor T1. The power supply voltage VDD may be directly transmitted to the bulk of the transistor T1.

In the embodiment of FIG. 6A, the switch SW1 is formed by the P-type transistor T2. When receiving the mode signal MODS with a low logic level, the switch SW1 is turned on correspondingly. By contrast, when receiving the mode signal MODS with a high logic level, the switch SW1 is cut off correspondingly. That is, when the input buffer IBUF is set to enabled (and the output buffer OBUF is set to disabled), the integrated circuit provides the mode signal MODS having a low logic level to make the switch SW1 to be turned on. Meanwhile, the diode apparatus formed by the transistor T1 provides the input end of the input buffer IBUF with a pull-up path. When the PAD is floating, the input end of the input buffer IBUF is pulled up to a predetermined voltage level and the leakage current which may be generated by the input buffer IBUF is reduced.

By contrast, when the input buffer IBUF is set to disabled (and the output buffer OBUF may be set to enabled), the integrated circuit provides the mode signal MODS having a high logic level to make the switch SW1 to be cut off. At this moment, the PAD voltage provided by the output buffer OBUF will not be affected by the pull-up function of the voltage holding circuit 610, and the normal operation state can be maintained.

In FIG. 6B, a transmission circuit 602 includes an input buffer IBUF and a voltage holding circuit 620. Unlike the previous embodiment, a transistor T3 used for forming a switch SW1 in the voltage holding circuit 620 is an N-type transistor. Thus, when receiving a mode signal MODS with a low logic level, the switch SW1 is correspondingly cut off. By contrast, when receiving the mode signal MODS with a high logic level, the switch SW1 is correspondingly turned on. That is, in the present implementation, when the input buffer IBUF is set to disabled, the integrated circuit provides the mode signal MODS a low logic level; when the input buffer IBUF is set to enabled, the integrated circuit provides the mode signal MODS a high logic level.

It is not difficult to understand from the above descriptions that, in the embodiments of the disclosure, the switch in the voltage holding circuit may be formed of a semiconductor device well known to a person ordinarily skilled in the art, and there is no particular limitation.

Figure 7:
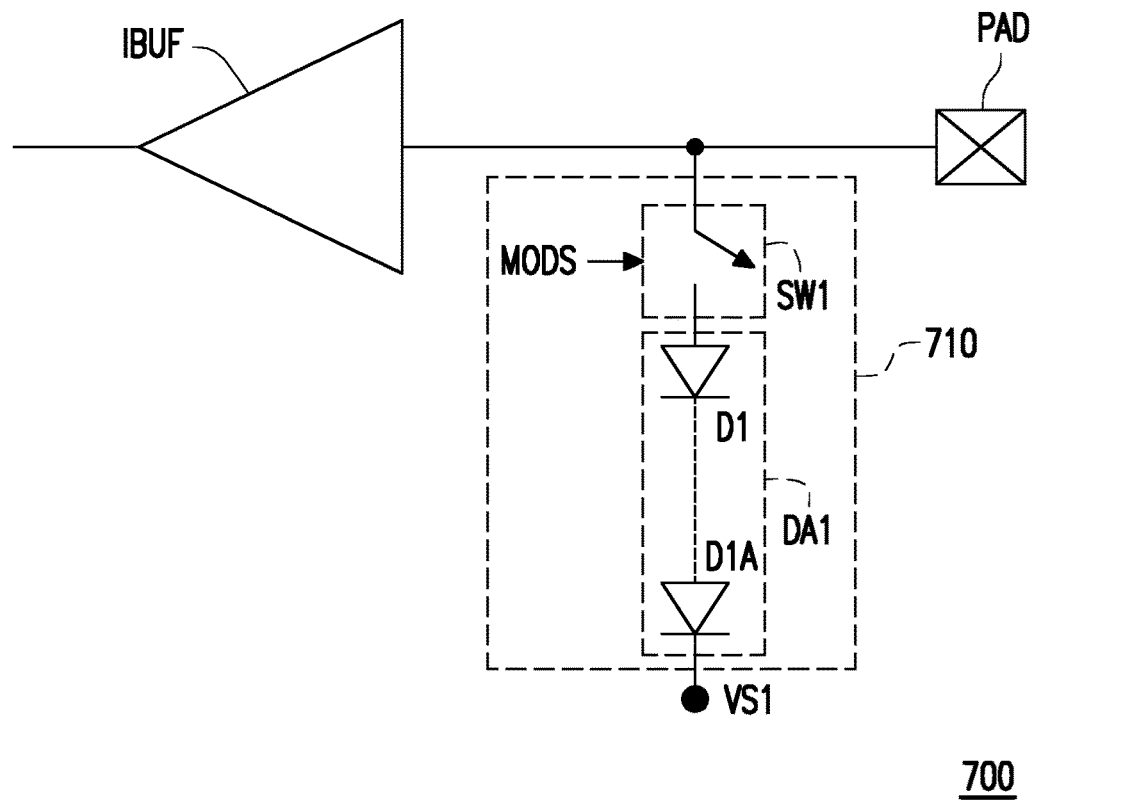
FIG. 7 illustrates a schematic diagram of a transmission circuit according to another embodiment of the disclosure.

Referring to FIG. 7, FIG. 7 illustrates a schematic diagram of a transmission circuit according to another embodiment of the disclosure. A transmission circuit 700 includes an input buffer IBUF and a voltage holding circuit 710. The voltage holding circuit 710 includes a diode apparatus DA1 formed of a plurality of diodes D1 to D1A and the switch SW1. The diodes D1 to DM. may be formed by diode-connected transistors. The diodes D1 to D1 A are coupled in series in the same polarity direction between the input end of the input buffer IBUF and the reference voltage end VS1. The number of the diodes D1 to D1A has no fixed limitation and may be set by a designer depending on the turn-on voltages of the diodes D1 to D1A and the input voltage range that may be received at the input end of the input buffer IBUF. In addition, the turn-on voltage for the diode apparatus DA1 may be determined by the types and the number of the diodes D1 to D1A. That is, the turn-on voltage of the diode apparatus DA1 is related to the types and the number of the diodes D1 to D1A.

Figure 8:
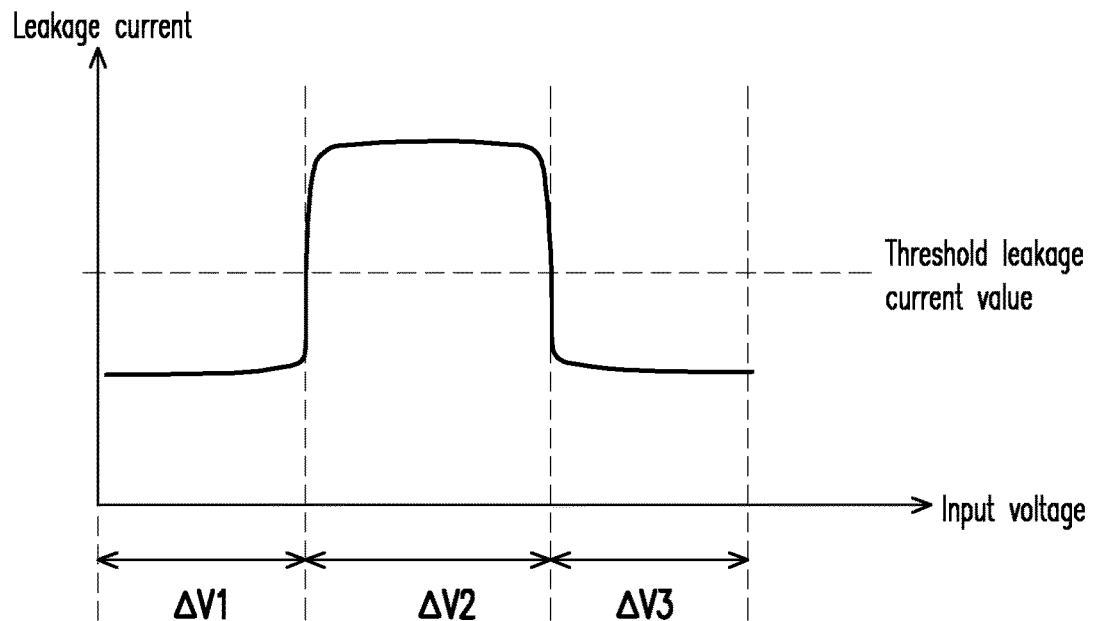
FIG. 8 illustrates a relationship between leakage current magnitude and input voltage range of an input buffer according to embodiments of the disclosure.

Referring to FIG. 7 and FIG. 8 together, FIG. 8 illustrates a relationship between leakage current magnitude and input voltage range of an input buffer according to embodiments of the disclosure. In FIG. 8, the input voltage range of the input buffer is divided into three regions: a voltage range $\Delta V1$, a voltage range $\Delta V2$ and a voltage range $\Delta V3$. The voltage in the voltage range $\Delta V1$ is smaller than the voltage in the voltage range $\Delta V2$, and the voltage in the voltage range $\Delta V2$ is smaller than the voltage in the voltage range $\Delta V3$. It can be known from FIG. 8 that, when the input voltage of the input buffer operated in the voltage ranges $\Delta V1$ or $\Delta V3$, the generated leakage current is much smaller than that when the input voltage of the input buffer operated in the voltage range $\Delta V2$. When the input voltage of the input buffer operated in the voltage ranges $\Delta V1$ or $\Delta V3$, the generated leakage current is smaller than a threshold leakage current value; when the input voltage of the input buffer operated in the voltage range $\Delta V2$, the generated leakage current is greater than the threshold leakage current value.

As can be seen from the relationship of FIG. 8, when the reference voltage end VS1 receives a relatively low common voltage (e.g., ground), the turn-on voltage of the diode apparatus DA1 in FIG. 7 may be determined by the voltage range $\Delta V1$. In other words, types and numbers of the diodes D1 to D1A may be determined by the voltage range $\Delta V1$; that is, the turn-on voltage of the diode apparatus DA1 is related to the types and numbers of the diodes D1 to D1A and the voltage range $\Delta V1$. Specifically, when the input buffer IBUF is enabled and the PAD is floating, the turn-on voltage of the diode apparatus DA1 formed of the diodes D1 to D1A may be designed to be smaller than the voltage range $\Delta V1$, so that the input end of the input buffer IBUF can be maintained at a predetermined voltage level within the voltage range $\Delta V1$, and the leakage current of the input buffer IBUF can be smaller than the threshold leakage current value. A larger number of diodes may reduce the leakage current of the PAD during high input voltage operation and maintain the high input voltage level. Therefore, the number of the diodes could be an optimal design choice for the PAD in different operation conditions.

By contrast, when the reference voltage end VS1 receives a relatively high common voltage (e.g., power supply voltage), the turn-on voltage of the diode apparatus DA1 may be determined by the voltage range $\Delta V3$. In other words, the types and numbers of the diodes D1 to D1A may be determined by the voltage range $\Delta V3$; that is, the turn-on voltage of the diode apparatus DA1 is related to the types and numbers of the diodes D1 to D1A and to the voltage range $\Delta V3$. Specifically, when the input buffer IBUF is enabled and the PAD is floating, the turn-on voltage of the diode apparatus DA1 formed of the diodes D1 to D1A may be designed to be smaller than the voltage range $\Delta V3$, so that the input end of the input buffer IBUF can be maintained at a predetermined voltage level within the voltage range $\Delta V3$. The leakage current of the input buffer IBUF can be smaller than the threshold leakage current value. A larger number of the diodes may reduce the leakage current of the pad during low input voltage operation and maintain the low voltage level. Therefore, the number of the diodes could be an optimal design choice for the PAD in different operation conditions.

In one embodiment, when a switch SW1 is formed of, for instance, a MOSFET, the transistor may be disposed as a transistor with a long channel length and a narrow channel width. For example, the channel width of the transistor is set to a minimum width and the channel length thereof may be set to a relatively longer length, so as to increase on-resistance and effectively reduce the leakage current when the switch SW1 is turned on.

Additionally, when the diodes D1 to D1A are formed of, for example, diode-connected transistors, the transistors may be disposed with a long channel length. For instance, the channel widths of the transistors are set to minimum widths, and the channel lengths thereof may be set to relatively longer lengths, so as to increase on-resistance and effectively reduce the leakage current when the diodes D1 to D1A are turned on.

Figure 9:
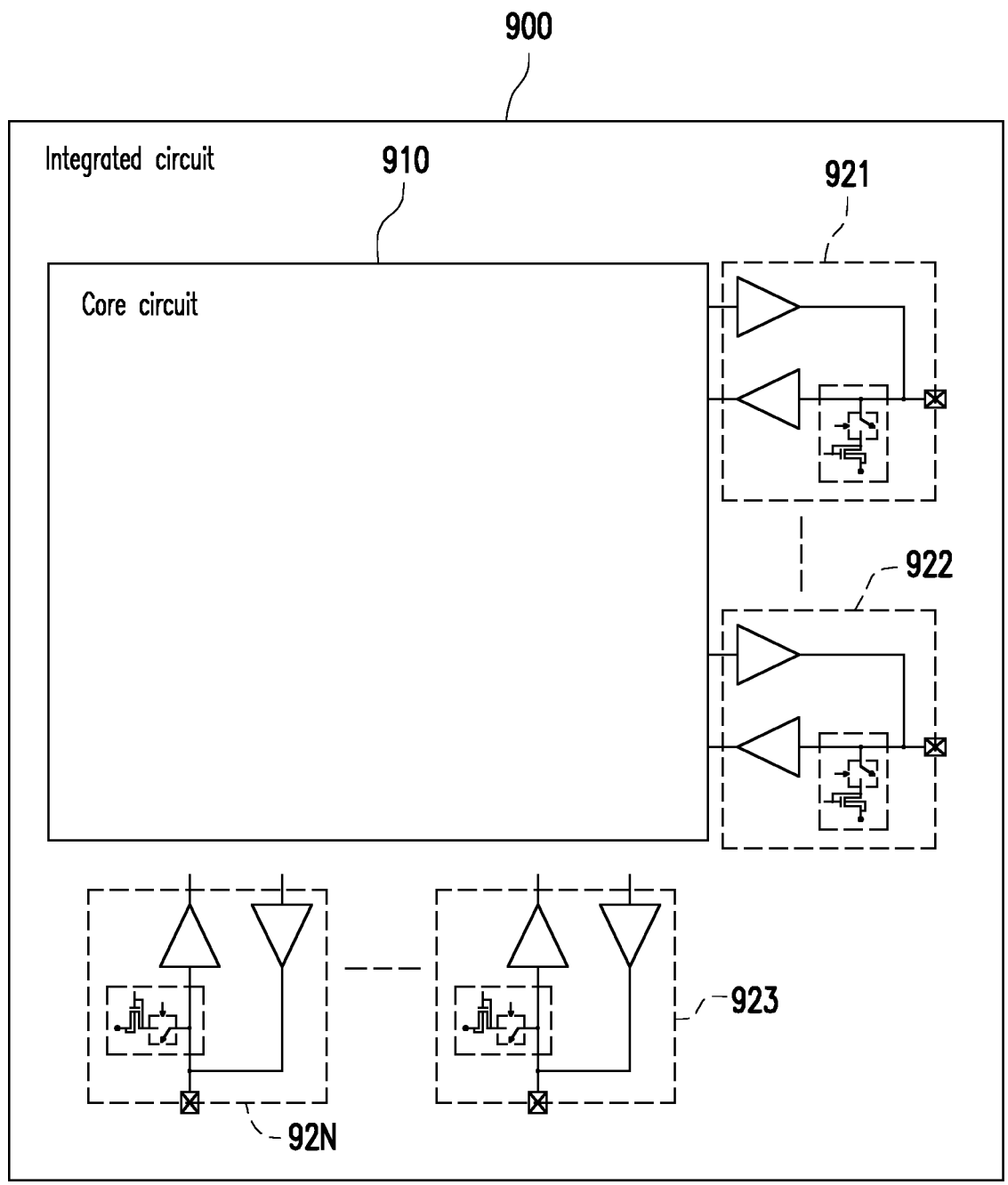
FIG. 9 illustrates a schematic diagram of an integrated circuit according to an embodiment of the disclosure.

Referring to FIG. 9, FIG. 9 illustrates a schematic diagram of an integrated circuit according to an embodiment of the disclosure. An integrated circuit 900 includes a core circuit 910 and transmission circuits 921 to 92N. The core circuit 910 is coupled to the transmission circuits 921 to 92N, and provides mode signals to the transmission circuits 921 to 92N.

In the embodiment, the number of transmission circuits may be one or more; the number is not limited and may be set according to actual needs. In addition, the transmission circuits 921 to 92N are not required to have the same circuit structure. Each of the transmission circuits 921 to 92N may be disposed according to the aforesaid embodiments and implementations and there is no particular limitation.

In summary, the disclosure provides several embodiments of the voltage holding circuit, which is disposed at the input end of the input buffer, and is also located between the input end of the input buffer and the reference voltage end. Each of these voltage holding circuits includes the switch and the diode apparatus coupled in series. In a case when the input buffer is enabled and the PAD is floating, the voltage holding circuit provides a turn-on path between the input end of the input buffer and the reference voltage end, so that the input end of the input buffer is maintained at a predetermined voltage level. In this way, leakage current generated by the input buffer may be effectively suppressed and ineffective power consumption is reduced.

It will be apparent to those who skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A transmission circuit comprising:
an input buffer having an input end coupled to a pad; and
a voltage holding circuit having a first end coupled to an input end of the input buffer, and a second end coupled to a reference voltage end, wherein the voltage holding circuit comprises at least one switch and at least one diode apparatus coupled in series between the first end and the second end of the voltage holding circuit, wherein the switch is configured to receive a mode signal, and is turned on or cut off according to the mode signal, and
wherein the input buffer is configured to be enabled or disabled depending on whether the input buffer is in the state of receiving signal, and the mode signal is generated corresponding to the state of the input buffer; and
wherein the input buffer is configured to be enabled and the at least one switch is configured to be turned on in response to the mode signal instructing the transmission circuit to operate in a first mode, and the input buffer is configured to be disabled and the at least one switch is configured to be turned off in response to the mode signal instructing the transmission circuit to operate in a second mode.

2. The transmission circuit according to claim 1, further comprising an output buffer, the output buffer having an output end coupled to the pad.

3. The transmission circuit according to claim 1, wherein:
the diode apparatus having a first end coupled to the input end of the input buffer; and
the switch having a first end coupled to a second end of the diode apparatus, the switch having a second end coupled to the reference voltage end.

4. The transmission circuit according to claim 1, wherein:
the switch having a first end coupled to the input end of the input buffer; and
the diode apparatus having a first end coupled to a second end of the switch, the diode apparatus having a second end coupled to the reference voltage end.

5. The transmission circuit according to claim 1, wherein the diode apparatus comprises at least one or a plurality of diodes coupled in series in a same polarity direction.

6. The transmission circuit according to claim 5, wherein the diode comprises a first transistor in the form of a diode.

7. The transmission circuit according to claim 1, wherein a turn-on voltage for the diode apparatus is smaller than a voltage range corresponding to a low threshold leakage current value of the input buffer.

8. The transmission circuit according to claim 1, wherein the input buffer is a hysteresis input buffer.

9. The transmission circuit according to claim 1, further comprising an output buffer, the output buffer having an output end coupled to the pad.

10. An integrated circuit comprising:
a core circuit; and
at least one transmission circuit according to claim 1, coupled to the core circuit;
wherein the core circuit coupled to the input buffer and the voltage holding circuit sets the input buffer enabled or disabled according to whether the input buffer is in the state of receiving signal, and generates the mode signal corresponding to the state of the input buffer.

11. An integrated circuit comprising:
a core circuit providing at least one mode signal; and
at least one transmission circuit coupled to the core circuit, comprising:
an input buffer having an input end coupled to a pad; and
a voltage holding circuit having a first end coupled to an input end of the input buffer, and a second end coupled to a reference voltage end, wherein the voltage holding circuit comprises at least one switch and at least one diode apparatus coupled in series between the first end and the second end of the voltage holding circuit, wherein the switch is configured to receive the at least one mode signal, and is turned on or cut off according to the at least one mode signal,
wherein the core circuit sets the input buffer enabled or disabled according to whether the input buffer is in a state of receiving signal, and generates the mode signal corresponding to the state of the input buffer,
wherein the input buffer is configured to be enabled and the at least one switch is configured to be turned on in response to the mode signal instructing the transmission circuit to operate in a first mode, and the input buffer is configured to be disabled and the at least one switch is configured to be turned off in response to the mode signal instructing the transmission circuit to operate in a second mode.

12. The integrated circuit according to claim 11, further comprising an output buffer, the output buffer having an output end coupled to the pad.

13. The integrated circuit according to claim 11, wherein:
the diode apparatus having a first end coupled to the input end of the input buffer; and
the switch having a first end coupled to a second end of the diode apparatus, the switch having a second end coupled to the reference voltage end.

14. The integrated circuit according to claim 11, wherein:
the switch having a first end coupled to the input end of the input buffer; and
the diode apparatus having a first end coupled to a second end of the switch, the diode apparatus having a second end coupled to the reference voltage end.

15. The integrated circuit according to claim 11, wherein the diode apparatus comprises at least one or a plurality of diodes coupled in series in a same polarity direction.

16. The integrated circuit according to claim 11, wherein a turn-on voltage for the diode apparatus is smaller than a voltage range corresponding to a low threshold leakage current value of the input buffer.

* * * * *